United States Patent [19]
Lee

[11] Patent Number: 5,384,750
[45] Date of Patent: Jan. 24, 1995

[54] DATA OUTPUT BUFFER OF A SYNCHRONOUS SEMICONDUCTOR MEMORY DEVICE

[75] Inventor: Ho-cheol Lee, Seoul, Rep. of Korea

[73] Assignee: Samsung Electronics Co., Ltd., Suwon, Rep. of Korea

[21] Appl. No.: 130,130

[22] Filed: Oct. 4, 1993

[30] Foreign Application Priority Data

Oct. 2, 1992 [KR] Rep. of Korea ............ 18133/92

[51] Int. Cl.$^6$ .............................................. G11C 8/00
[52] U.S. Cl. ................................ 365/233; 365/189.05; 365/193
[58] Field of Search ............ 365/233, 191, 193, 189.05, 365/230.08, 203, 189.12, 194

[56] References Cited

U.S. PATENT DOCUMENTS 4,719,601 1/1988 Gray et al. ............ 365/189.05
5,287,327 2/1994 Takasugi ............ 365/189.25

Primary Examiner—Joseph A. Popek
Attorney, Agent, or Firm—Cushman Darby & Cushman

[57] ABSTRACT

A data output buffer is used for a synchronous semiconductor memory device carrying out a data read/write operation in synchronism with an externally supplied clock. The semiconductor memory device includes a first shift register having a plurality of clock stages for transmitting a $\overline{RAS}$ signal in response to the clock; a circuit for extracting a data output margin signal from a predetermined stage among the stages of the first shift circuit; first latch circuits each receiving the data output margin signal, for generating a plurality of first latency signals having information on the $\overline{RAS}$ signal by combining row address signals and the signals extracted from the respective clock stages of the first shift circuit; a second shift circuit having a plurality of clock stages for transmitting a $\overline{CAS}$ signal in response to the clock; second latch circuits each receiving the data output margin signal, for generating a plurality of second latency signals having information on the CAS signal by combining column address signals and the signals extracted from the respective clock stages of the second shift circuit; and a latency combination circuit receiving the first and second latency signals, for generating a data output control signal to the data output buffer, so that the data output buffer can generate data output even during a $\overline{RAS}$ precharge cycle.

12 Claims, 11 Drawing Sheets

DATA OUTPUT BUFFER OF A SYNCHRONOUS SEMICONDUCTOR MEMORY DEVICE

BACKGROUND OF THE INVENTION

1. Field of the Invention

This invention relates to a semiconductor memory device, and more particularly to a data output buffer used for a synchronous semiconductor memory device performing a data read/write operations in synchronism with an externally supplied clock.

2. Description of the Related Art

A dynamic RAM, a typical readable/writable memory, is essentially provided with a row address strobe (hereinafter referred to as "RAS") signal and a column address strobe (hereinafter referred to as "CAS") signal, respectively supplied from an external circuit such as a CPU, so as to read or write data from/into a memory cell therein.

FIG. 1A shows timing diagram for a read cycle in a conventional dynamic RAM. A row address signal RA is input to the memory device after a $\overline{RAS}$ signal has been enabled to "low" logic state followed by a column address signal CA being input in response to a $\overline{CAS}$ signal being enabled to "low" logic state while the $\overline{RAS}$ signal is held active. During this time, data stored in a memory cell corresponding to an address signal input is sensed by a sense amplifier. The data sensed is output through a data output buffer. When this takes place, data paths of the data output buffer are connected or disconnected according to an output enable signal $\overline{OE}$ (see FIG. 1B). It is well known that an output enable signal $\overline{OE}$ is generated by using a control clock supplied from a CPU and from a signal generated in the memory chip for data sensing.

In a conventional dynamic RAM, during one $\overline{CAS}$ cycle, only one bit of the output data is output in page mode while four bits of output data are output in nibble mode. Data output operations are inhibited once the $\overline{RAS}$ signal is disabled at which time the memory device enters a precharge mode. In practice, however, during every read cycle, a time interval ($t_{RAC}$) spanning from an enabling point of the $\overline{RAS}$ signal to a point in time when the output data is substantially generated responding to the $\overline{RAS}$ signal, is essentially required. A data input/output line is equalized and precharged during the time interval from when data is output from the memory chip during an $\overline{RAS}$ cycle to when a next data is again output at the next $\overline{RAS}$ cycle. Thus, it should be apparent that the above mentioned time interval $t_{RAC}$ is much longer than a time required for equalizing and precharging the data input/output line. That is, a time loss is unnecessarily caused between a current data output cycle and a next data output cycle.

A conventional dynamic RAM also performs data access operations asynchronously. A data bus and an input/output bus are equalized and precharged at various time intervals between a current and a next read cycle, between a read and a write cycle, and between a current and a next write cycle. Moreover, a memory device formed on an integrated circuit receives TTL level signals provided from a CPU and converts them to CMOS level signals before using them. As is well known, present day CPU operation speeds are far more improved than the speeds of conventional memory devices. Manufacturers have as a result recognized the need to make the operation speeds of memory devices faster, which would result in shorter data access times.

However, the operation speed of a conventional asynchronous dynamic RAM can only be increased so much and no more given its unique operation structure. To solve the problem of slow data access times, a memory device is needed that is capable of carrying out a data read/write operation in synchronism with an external clock supplied from a CPU.

SUMMARY OF THE INVENTION

It is therefore an object of the present invention to provide a data output buffer capable of carrying out an effective data output operation, used for a memory device operating in synchronism with a clock supplied from an external source.

It is another object of the present invention to provide a semiconductor memory device having a data output buffer controlling device capable of outputting data even during a $\overline{RAS}$ precharge cycle.

It is also another object of the present invention to provide a semiconductor memory device having a device for controlling a data output buffer in synchronism with a clock supplied from an external source.

According to an aspect of the present invention, a semiconductor memory device includes a first shift register having a plurality of clock stages for transmitting a $\overline{RAS}$ signal in response to the clock; a circuit for extracting a data output margin signal from a predetermined stage among the stages of the first shift circuit; first latch circuits each receiving the data output margin signal, for generating a plurality of first latency signals having information on the $\overline{RAS}$ signal by combining row address signals and the signals extracted from the respective clock stages of the first shift circuit; a second shift circuit having a plurality of clock stages for transmitting a $\overline{CAS}$ signal in response to the clock; second latch circuits each receiving the data output margin signal, for generating a plurality of second latency signals having information on the $\overline{CAS}$ signal by combining column address signals and the signals extracted from the respective clock stages of the second shift circuit; and a latency combination circuit receiving the first and second latency signals, for generating a data output control signal to the data output buffer, so that the data output buffer can generate data output even during a $\overline{RAS}$ precharge cycle.

The present invention will now be described more specifically with reference to the drawings attached only by way of example.

DETAILED DESCRIPTION OF THE PREFERRED EMBODIMENTS

Figure 2:
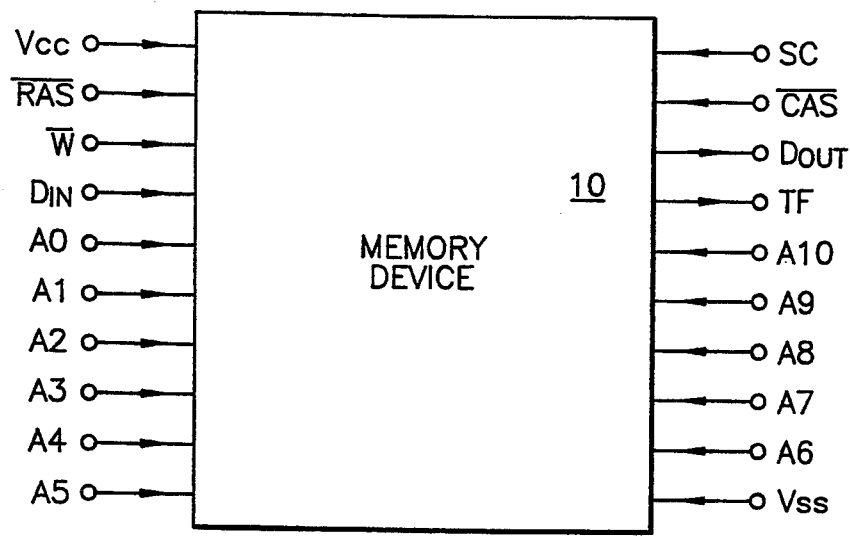
FIG. 2 shows a pin configuration of a dynamic RAM using an external system clock, to which the present invention is applied.

A data output buffer according to the present invention is applied to a memory device 10 that processes all signals in response to a clock (hereinafter referred to as "system clock") supplied from an external source, as shown in FIG. 2 which illustrates a basic pin configuration of a synchronous dynamic RAM operating in synchronism with the system clock SC. In this figure, Vcc indicates a power supply pin, $\overline{W}$ a write control signal input pin, $D_{IN}$ a data input pin, A0–A10 address input pins, $D_{OUT}$ a data output pin, TF a test pin, Vss a ground voltage pin, $\overline{RAS}$ a row address strobe signal input pin, and $\overline{CAS}$ a column address strobe signal input pin. Moreover, a pin SC for receiving a system clock from a CPU (not shown) is illustrated.

The various embodiments of the present invention will be discussed with reference to a dynamic RAM environment, for the sake of simplicity. It is noted, however, that other memory devices, such as a static RAM, can be used to implement the inventive concept of the presently disclosed embodiments. In the following description of the preferred embodiments of the present invention, data stored in a memory cell is accessed in synchronism with the system clock as a reference clock which operates as a reference clock.

Figure 3:
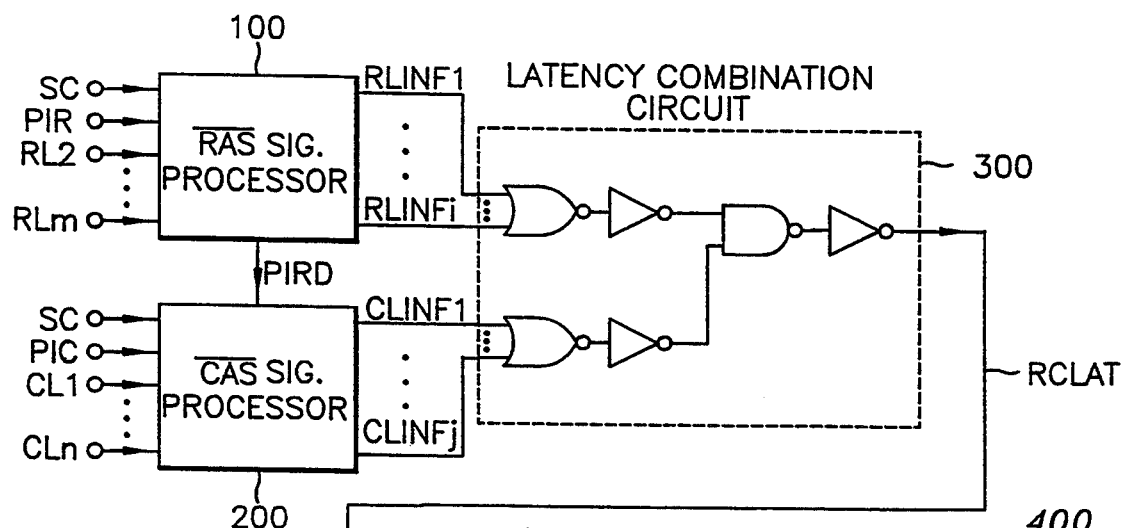
FIG. 3 is a schematic diagram of a data output buffer and a control circuit therefor according to an embodiment of the present invention.
Figure 3:
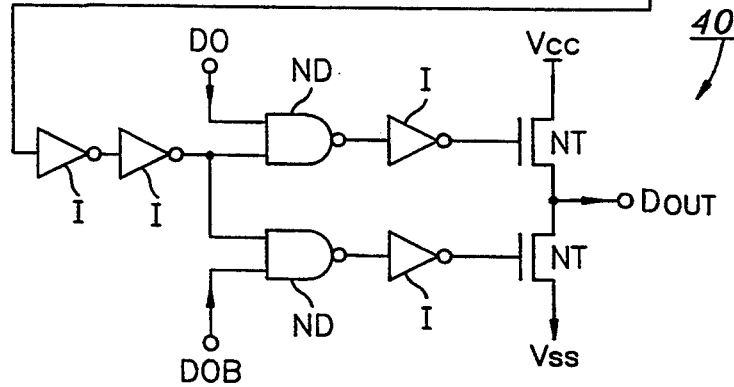

FIG. 3 shows a generation of a latency signal RCLAT for controlling a data output buffer 400 and how the data output buffer 400 operates using the latency signal RCLAT. As shown in FIG. 3, a $\overline{RAS}$ signal processor 100 receives a system clock SC, a $\overline{RAS}$ master clock PIR, and row address combination signals RL1-RLm and outputs $\overline{RAS}$ latency signals RLINF1 to RLINFi, and a data output margin signal PIRD used to ensure the outputting of data even during a $\overline{RAS}$ precharge cycle. $\overline{RAS}$ master clock PIR is a signal generated in synchronism with system clock SC which is triggered up after the $\overline{RAS}$ signal has entered into its active cycle or is enabled. In ints present context, the term "$\overline{RAS}$ latency" refers to a time interval from an enabling point of the $\overline{RAS}$ signal to a point in time when an output is generated responding to the $\overline{RAS}$ signal.

$\overline{CAS}$ signal processor 200 is also provided which receives the system clock SC, a $\overline{CAS}$ master clock PIC, the column address combination signals CL1-CLn, and the data output margin signal PIRD generated from the $\overline{RAS}$ signal processor 100, and generates $\overline{CAS}$ latency signals CLINF1 to CLINFj. The $\overline{CAS}$ master clock PIC, as with signal PIR, is a signal generated in synchronism with system clock SC which is triggered up after a $\overline{CAS}$ signal has entered its active cycle or is enabled. The term "$\overline{CAS}$ latency" refers to a time interval from an enabling point of the $\overline{CAS}$ signal to a point in time when an output is generated responding to the $\overline{CAS}$ signal.

The $\overline{RAS}$ latency signals RLINF1-RNLINFi and $\overline{CAS}$ latency signals CLINF1-CLINFj, respectively generated from the $\overline{RAS}$ signal processor 100 and the $\overline{CAS}$ signal processor 200 are input into a latency combination circuit 300 comprised of logic gates such as NOR gates, a NAND gate, and inverters. The latency combination circuit 300, by using the $\overline{RAS}$ latency signals RLINF1-RLINFi and the $\overline{CAS}$ latency signals CLINF1-CLINFj, generates the latency signal RCLAT into which the information of the $\overline{RAS}$ latency signals and the $\overline{CAS}$ latency signals is included and then, inputs the latency signal RCLAT to the data output buffer 400.

Figure 1A:
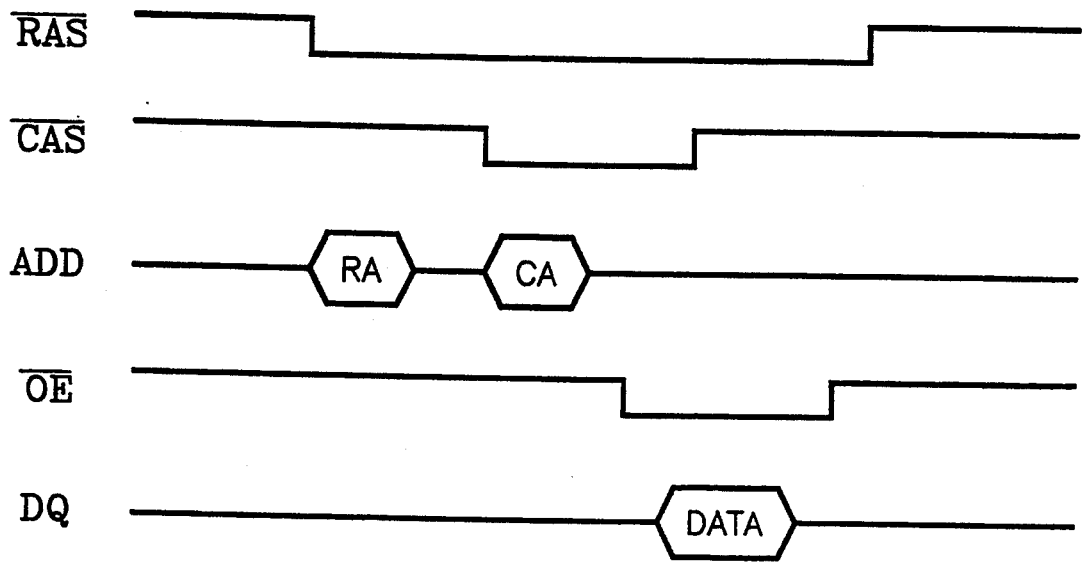
FIG. 1A is a timing diagram used to describe a data outputting process of a conventional dynamic RAM.
Figure 1B:
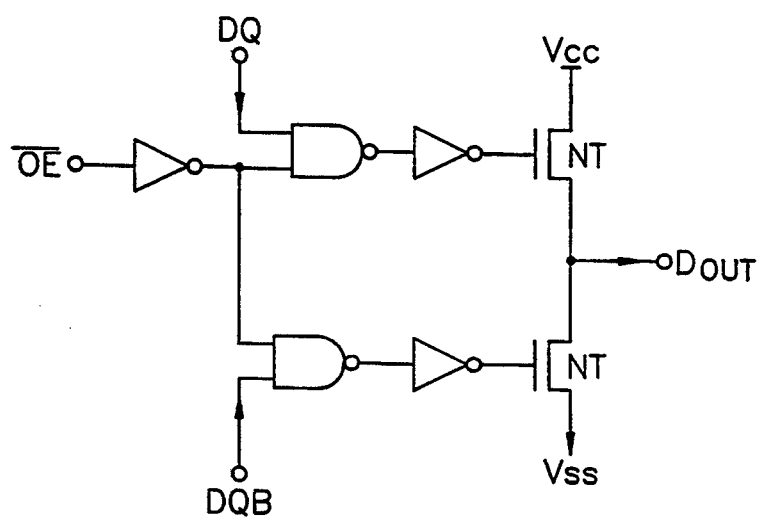
FIG. 1B is a circuit diagram of a data output buffer of a conventional dynamic RAM.

The latency signal RCLAT controls data transmission paths of the data output buffer 400 and a time interval thereof during which the data is output. Latency signal RCLAT serves as the output enable signal $\overline{OE}$ in the conventional data output buffer shown in FIG. 1B. It should be noted that latency signal RCLAT can be generated from both the $\overline{RAS}$ signal and the $\overline{CAS}$ signal, or from either of those signals.

When using only an $\overline{RAS}$ signal according to one embodiment of the present invention shown in FIG. 3, for example, the latency signal RCLAT can be generated by changing one of $\overline{RAS}$ latency signals RLINF1-RLINFj to an active state using the $\overline{RAS}$ signal processor 100 only and removing the $\overline{CAS}$ signal processor 200, and then inputting the activated signal into latency combination circuit 300.

Figure 4A:
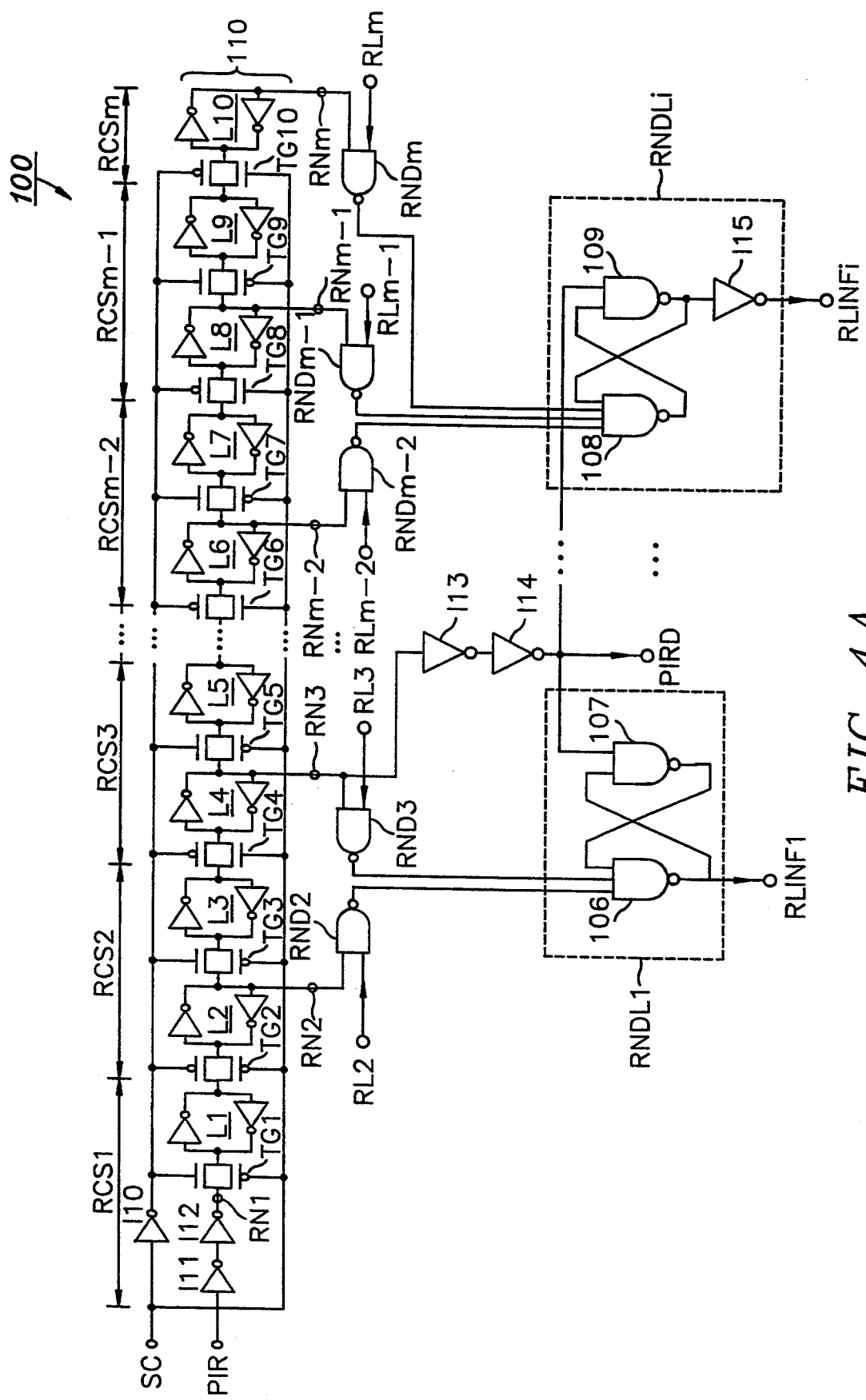
FIG. 4A is a detailed circuit diagram of the $\overline{RAS}$ signal processor 100 shown in FIG. 3.
Figure 4B:
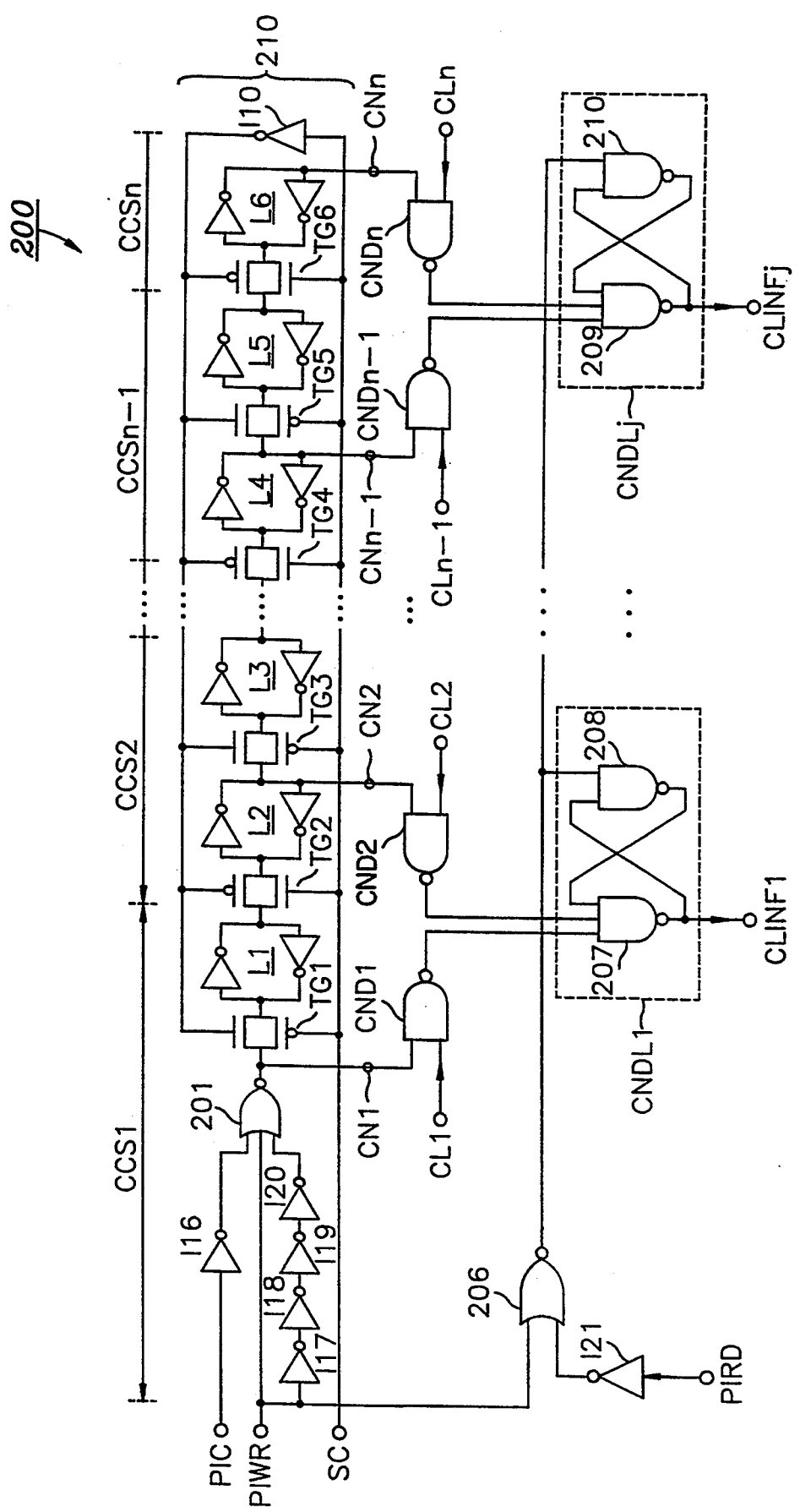
FIG. 4B is a detailed circuit diagram of the $\overline{CAS}$ signal processor 200 shown in FIG. 3.

FIGS. 4A and 4B are examples of the detailed circuit configurations of the $\overline{RAS}$ signal processor 100 and the $\overline{CAS}$ signal processor 200 that are block-marked respectively in FIG. 3. As shown in FIG. 4A, the $\overline{RAS}$ signal processor 100 is comprised of a shift register 110 having m clock stages RCS1-RCSm, m-1 NAND gates RND2-RNDm each receiving the row address signals RL2-RLm and the voltage at nodes RN2-RNm respectively located in all the clock stages except the first clock stage, inverters I13, I14 connected in series for supplying the data output margin signal PIRD that had been extracted from a node of a clock stage (in the case of FIG. 4A, a node RN3 in the third clock stage RCS3) to the $\overline{CAS}$ signal processor 200, NAND gates 106 ... 108 each receiving signals output from corresponding two adjacent NAND gates among the NAND gates RND2-RNDm, NAND gates 107 ... 109 each receiving the data output margin signal PIRD. Latch circuits RNDL1-RNDLi are thus provided generating i $\overline{RAS}$ latency signals RLINF1-RLINFi.

Of latch circuits RNDL1-RNDLi, the respective latch circuits connected to the clock stages positioned before (or left hand side of) a clock stage from which the data output margin signal PIRD is extracted, are coupled to the output signals of the NAND gates receiving the signals output from the adjacent two clock stages among the clock stages RCS2-RCSm, and the rest of the latch circuits positioned after (or right hand side of) a clock stage from which the data output margin signal PIRD is extracted are coupled to the NAND gates receiving the signals output from consecutive three clock stages. If the data output margin signal PIRD is extracted from a node RN1 of the first clock stage RCS1 instead of the node RN3 of the third clock stage RCS3, all the latch circuits RNDL1-RNDLi would receive the outputs of the consecutive three NAND gates RND1/RND2/RND3;

RND4/RND5/RND6; . . . ; and RNDm-2/RNDm-1/RNDm, respectively.

First clock stage RCS1 is comprised of a transfer gate TG1 and a latch L1 connected in series and receives the $\overline{RAS}$ master clock PIR via inverters I11 and I12 connected in series. Of transfer gates TG1-TG10 included in the respective stages, p-type transfer gates TG1, TG3, TG5, TG7, TG9 and n-type transfer gates TG2, TG4, TG6, TG8, TG10 are alternatively arranged and are all controlled according to the system clock SC. Accordingly, when system clock SC goes to logic "high" state, n-type transfer gates TG2, TG4, TG6, TG8, TG10 are all turned on. According to the embodiment of FIG. 4A, 2 bits of output data are further generated even after the $\overline{RAS}$ signal has entered a precharge cycle because data output margin signal PIRD is extracted from the node RN3 of third clock stage RCS3. However, the extracting position of data output margin signal PIRD can be changed according to how many bits of the output data should be generated even during the $\overline{RAS}$ precharge cycle. A relationship between an extracting position of data output margin signal PIRD and the number of output data bits desired to be generated during an $\overline{RAS}$ precharge cycle will be explained in detail herebelow.

Referring to FIG. 4B, the $\overline{CAS}$ signal processor 200 has a shift register 210 composed of n clock stages CCS1-CCSn as in the case of a circuit configuration of the $\overline{RAS}$ signal processor 100 illustrated in FIG. 4A, as well as n NAND gates CND1-CNDn each receiving the signals at nodes CN1-CNn of the respective clock stages CCS1-CCSn and column address combination signals CL1-CLn. Of the NAND gates CND1-CNDn, the signals being output from two adjacent clock stages are input to NAND gates 207 . . . 209, respectively. NAND gates 208 . . . 210 each receiving the output of a NOR gate 206 for receiving the data output margin signal PIRD and a write master clock PIWR to notify the state of the data output margin signal PIRD, together with the NAND gates 207 and 209, constitute j latch circuits CNDL1-CNDLj for generating j $\overline{CAS}$ latency signals CLINF1-CLINFj.

Figure 4C:
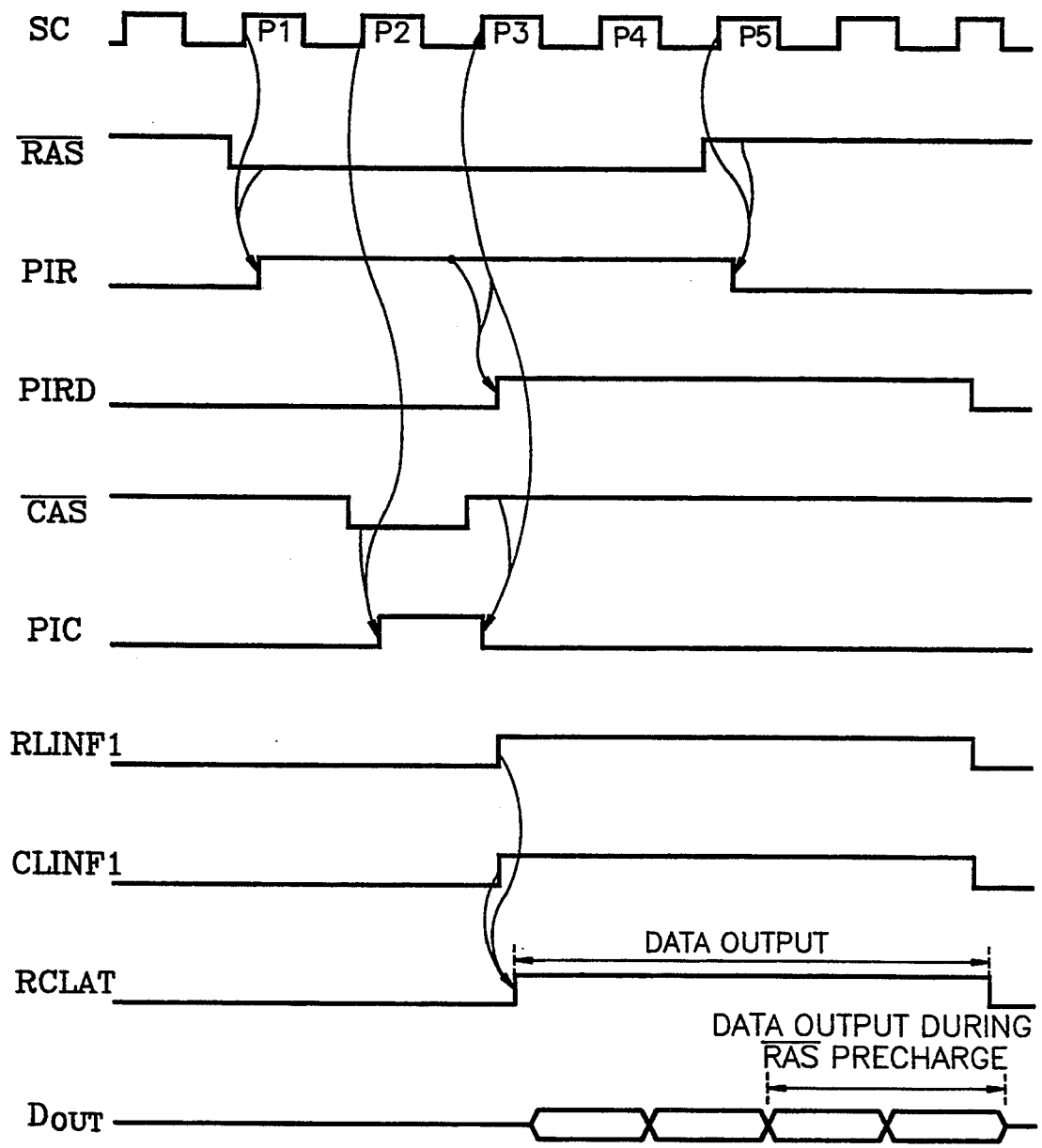
FIG. 4C is a timing diagram of a read operation in the device of FIG. 3.
Figure 4D:
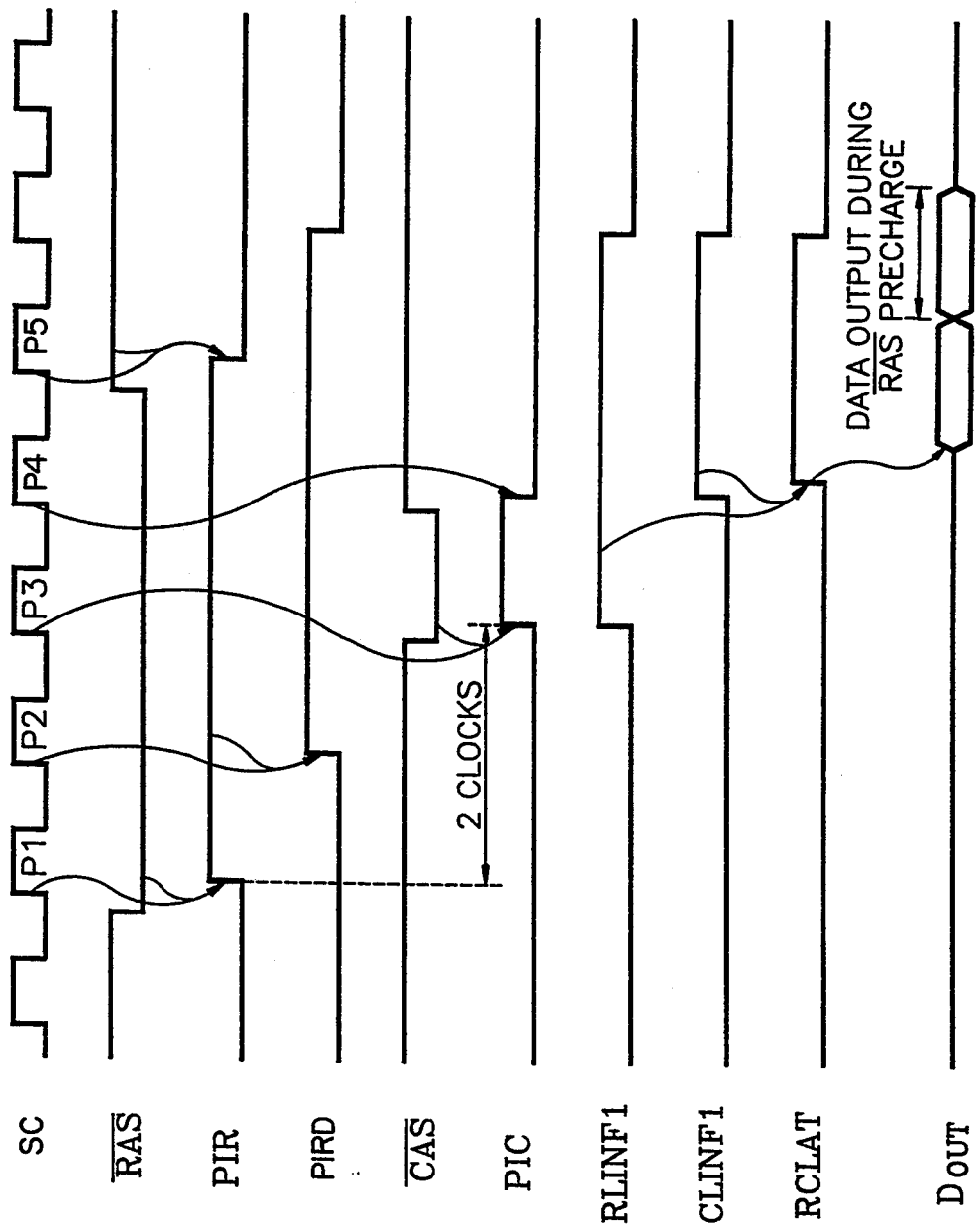
FIG. 4D is a timing diagram of yet another read operation in the device of FIG. 3.

FIG. 4C illustrates a timing operation for the case where data output margin signal PIRD is extracted from node RN3 as shown in FIG. 4A. FIG. 4D shows a timing operation for the case where data output margin signal PIRD is extracted from node RN2 instead (not shown).

Referring to FIG. 4C, after the $\overline{RAS}$ signal has entered its active cycle logic "low" state, $\overline{RAS}$ master clock PIR is enabled to logic "high" state in synchronism with a rising edge of system clock SC. Similalrly, after the $\overline{CAS}$ signal has entered its active cycle logic "low" state, $\overline{CAS}$ master clock PIC is enabled to logic "high" state in synchronism with a rising edge of system clock SC. As shown in FIG. 4A, the $\overline{RAS}$ master clock PIR supplied to the clock stage RCS1 is transferred to node RN3 at a rising edge of the third pulse of the system clock signal SC. It should be noted that an initial value of each clock stage of shift registers 110 and 210 respectively illustrated in FIGS. 4A and 4B is the logic "low" state and that only row address signal RL3 among the row address combination signals RL2-RLm is in logic "high" state. Similarly, only signal CL2 among the column address combination signals CL1-CLn is in logic "high" state.

A detailed description the setting of row address combination signals has been omitted as such is well known in the field. It is noted from the foregoing that some of the row and column address combination signals are set to logic "high" state initially. Those signals set to logic "high" state initially are determined on the basis of how many pulses of the system clock SC should be generated after the activation of the $\overline{RAS}$ signal or the $\overline{CAS}$ signal. As shown in the timing diagram of FIG. 4C, output data is generated through a data output buffer 400 illustrated in FIG. 3 at a rising edge of a pulse P3 of the system clock SC generated after the $\overline{RAS}$ signal is activated when only the signal RL3 among row address combination signals RL2-RLm shown in FIG. 4A is supplied to NAND gate RND3 in logic "high" state. Output data is generated through data output buffer 400 illustrated in FIG. 3 at the rising edge of the pulse P3 of the system clock SC after the $\overline{CAS}$ signal is activated when only the signal CL2 among column address combination signals CL1-CLn shown in FIG. 4B is supplied to NAND gate CND2 in logic "high" state.

The outputs of NAND gates RND2, and RND4-RNDm (with the exception of NAND gate RND3) are all in logic "high" state since the potential at node RN3, an output of the clock stage RCS3, is in logic "high" state. Row address combination signal RL3 is in logic "high" state, and all remaining row address combination signals RL2, RL4-RLm are in logic "low" state.

Meanwhile, data output margin signal PIRD, being generated through inverters I13 and I14 and connected in series from node RN3 has active cycle in logic "high" state which was delayed three pulses of the system clock SC compared to the active cycle logic "low" state of the $\overline{RAS}$ signal. This is because data output margin signal PIRD is extracted from third clock stage RCS3 of shift register 110. Accordingly, when data output margin signal PIRD is in logic "high" state active cycle, NAND gate 106 receives the logic "low" state signal supplied from NAND gate RND3 and, as a result, only the $\overline{RAS}$ latency signal RLINF1 which an output from latch circuit RNDL1 is generated in logic "high" state.

As shown in FIG. 3, the $\overline{RAS}$ latency signal RLINF1 in logic "high" state is supplied to latency combination circuit 300 and data output margin signal PIRD is supplied to $\overline{CAS}$ signal processor 200. In $\overline{CAS}$ signal processor 200 of FIG. 4B, the potential at node CN2 of second clock stage CCS2 goes to logic "high" state at a rising edge of pulse P3 of the system clock SC which appears first after the $\overline{CAS}$ master clock PIC had been activated to logic "high" state. Also, because only the signal CL2 among column address combination signals CL1-CLn is in logic "high" state in accordance with the previously mentioned conditions, only an output of NAND gate CND2 among NAND gates CND1-CNDn is generated in logic "low" state. Moreover, the logic state of data output margin signal PIRD is reversed and then input into a NOR gate 206 along with a write master clock signal PIWR which is disabled (logic "low" state) during a read operation. The output of NOR gate 206 is input to NAND gates 208 and 210 of latch circuits CNDL1-CNDLj. Therefore, as in FIG. 4A, latch circuits CNDL1-CNDLj generate the $\overline{CAS}$ latency signals CLINF1-CLINFj in response to outputs of NAND gates CND1-CNDn. Accordingly, only the $\overline{CAS}$ latency signal CLINF1 is output to logic "high" state while data output margin signal PIRD is in a logic "high" state active cycle.

The $\overline{CAS}$ latency signal CLINF1 is supplied along with the $\overline{RAS}$ latency signal RLINF1 to latency combination circuit 300 of FIG. 3. Finally, as shown in FIG. 3, only one among $\overline{RAS}$ latency signals RLINF1-RLINFi input into latency combination circuit 300 changes to logic "high" state and only one among $\overline{CAS}$ latency signals CLINF1-CLINFj turns to logic "high" state. Accordingly, latency signal RCLAT which is output from latency combination circuit 300 is generated as logic "high" state before being supplied to data output buffer 400. As shown in the timing diagram of FIG. 4C, data detected from a memory cell through data output buffer 400 is output because latency signal RCLAT remains in logic "high" state while data output margin signal PIRD is maintained in logic "high" state. It should be particularly noted that 2 bits of the output data are generated even after the $\overline{RAS}$ signal enters into the precharge cycle in logic "high" state. By comparison, in conventional memory devices, data cannot be output when the $\overline{RAS}$ signal is in the precharge cycle.

FIG. 4D illustrates a read timing diagram for the case where data output margin signal PIRD is extracted from node RN2 of second clock stage RCS2. This is intended to explain how the number of data bits to be output during a $\overline{RAS}$ precharge cycle can be adjusted freely according to an extracting position of data output margin signal PIRD. The Data output margin signal PIRD is synchronized with the rising edge of the pulse P2 of the system clock SC generated after $\overline{RAS}$ signal is activated and then, is activated to logic "high" state.

Also, compared to the $\overline{CAS}$ activation shown in FIG. 4C, $\overline{CAS}$ activation shown in FIG. 4C is delayed by one cycle of the system clock SC. Therefore, it becomes apparent that $\overline{CAS}$ latency signal CLINF1 is input to latency combination circuit 300 of FIG. 3 after being delayed by one system clock cycle when compared to the $\overline{RAS}$ latency signal RLINF1. Accordingly, the latency signal RCLAT for controlling the data output buffer 400 changes to logic "high" state when the $\overline{RAS}$ and $\overline{CAS}$ latency signals RLINF1 and CLINF1 are both enabled to logic "high" state thus enabling data output buffer 400 to output data.

Furthermore, because the activation period of data output margin signal PIRD is shortened by one system clock cycle relative to that of FIG. 4C, the number of output data bits that is secured after the $\overline{RAS}$ signal is precharged is equal to one. As shown in FIGS. 4C and 4D, the number of output data bits generated after the $\overline{RAS}$ signal is precharged according to an extracting position of data output margin signal PIRD can be extended or shortened freely before a next $\overline{RAS}$ cycle begins; that is, during a time span excluding the time required for equalizing and precharging the input/output lines.

Figure 5:
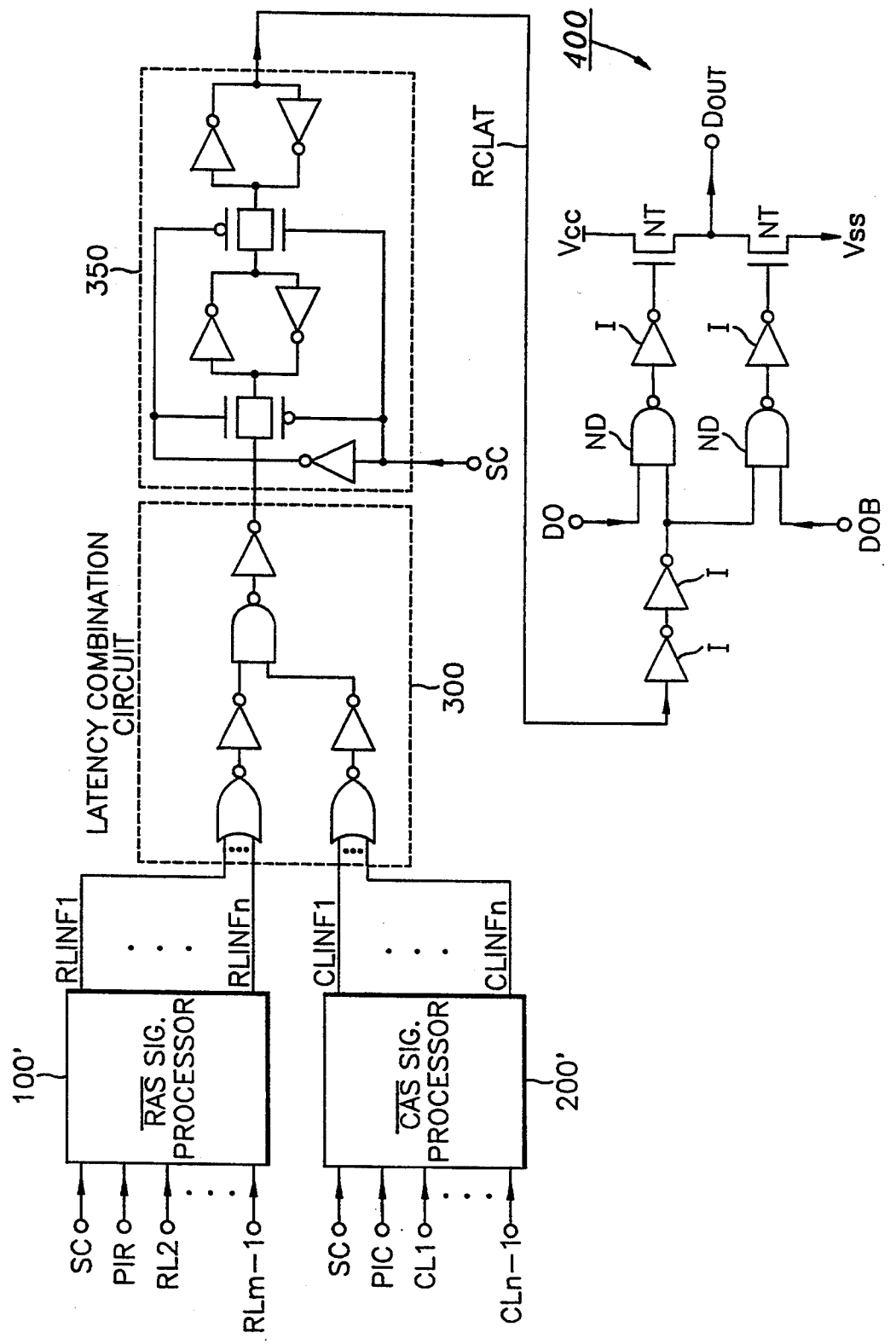
FIG. 5 is a schematic diagram of a data output buffer and a control circuit therefor according to another embodiment of the present invention.

Referring to FIG. 5 showing another embodiment of the present invention, a $\overline{RAS}$ signal processor 100' and a $\overline{CAS}$ signal processor 200' respectively include shift registers each having clock stages similar in structure to shift registers 110 and 210 of FIGS. 4A and 4B. However, the number of clock stages included in these shift registers each is one less in number than that of the shift resistors 110 and 210 of FIGS. 4A and 4B.

In addition, a shift stage 350 is connected to an output of latency combination circuit 300 of FIG. 3 so as to generate the latency signal RCLAT through this shift stage 350. Other configurations are similar in structure and operation as described previously in connection with the embodiment of FIG. 3.

Figure 6A:
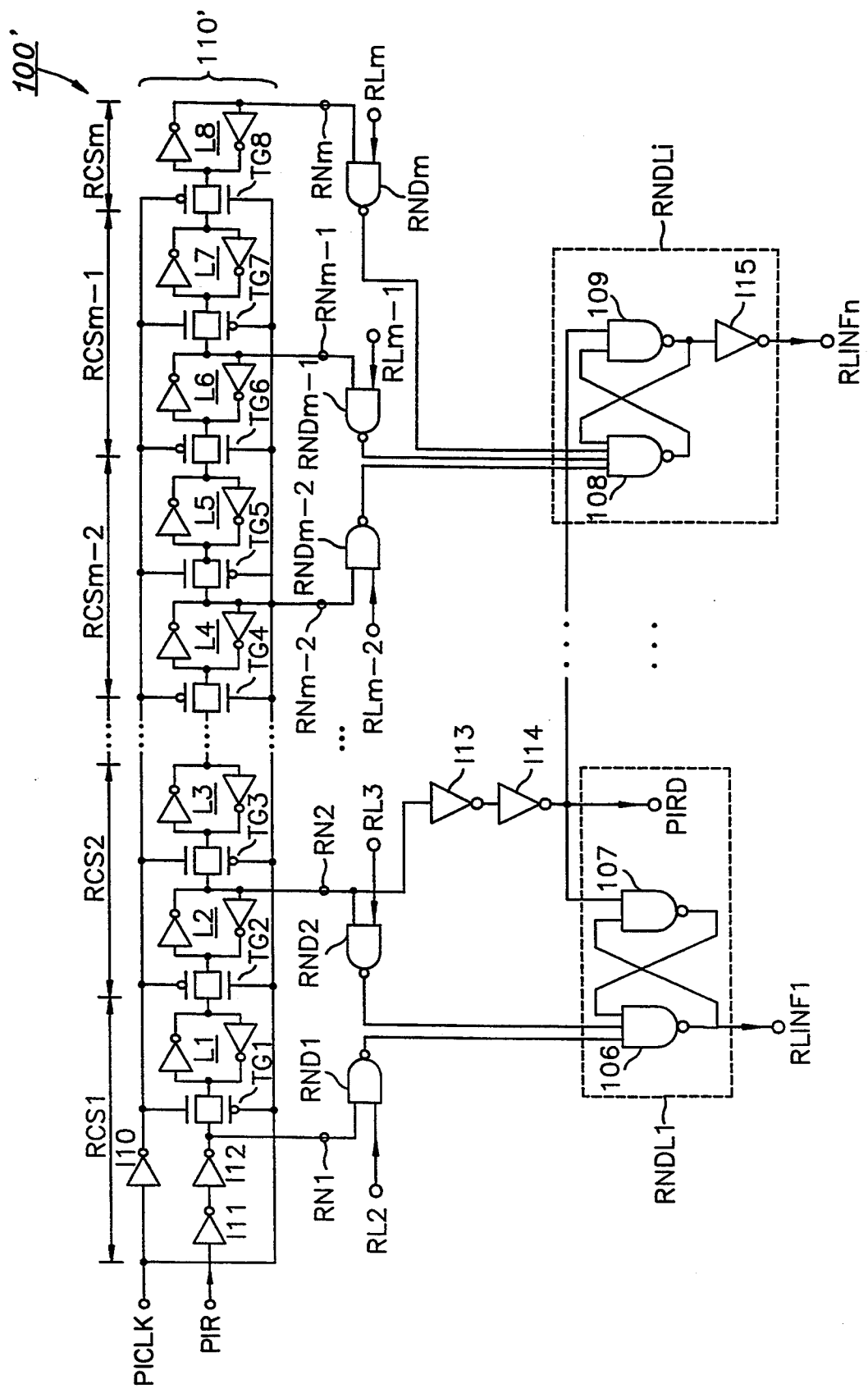
FIG. 6A is a detailed circuit diagram of the $\overline{RAS}$ signal processor 100' shown in FIG. 5.
Figure 6B:
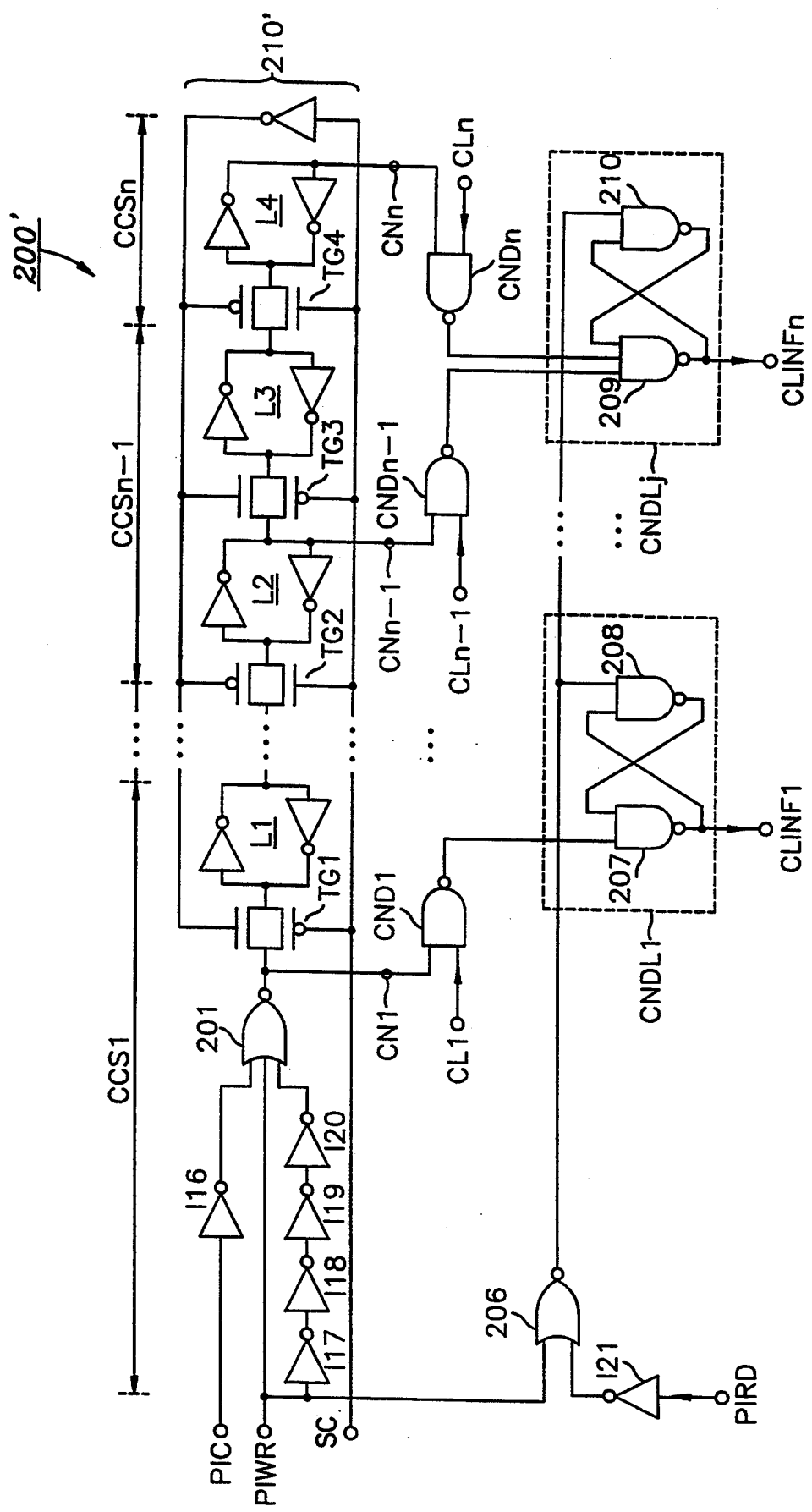
FIG. 6B is a detailed circuit diagram of the $\overline{CAS}$ signal processor 200' shown in FIG. 5.

The detailed circuit diagram of $\overline{RAS}$ signal processor 100' and $\overline{CAS}$ signal processor 200' of FIG. 5 are illustrated respectively in FIGS. 6A and 6B.

Figure 6C:
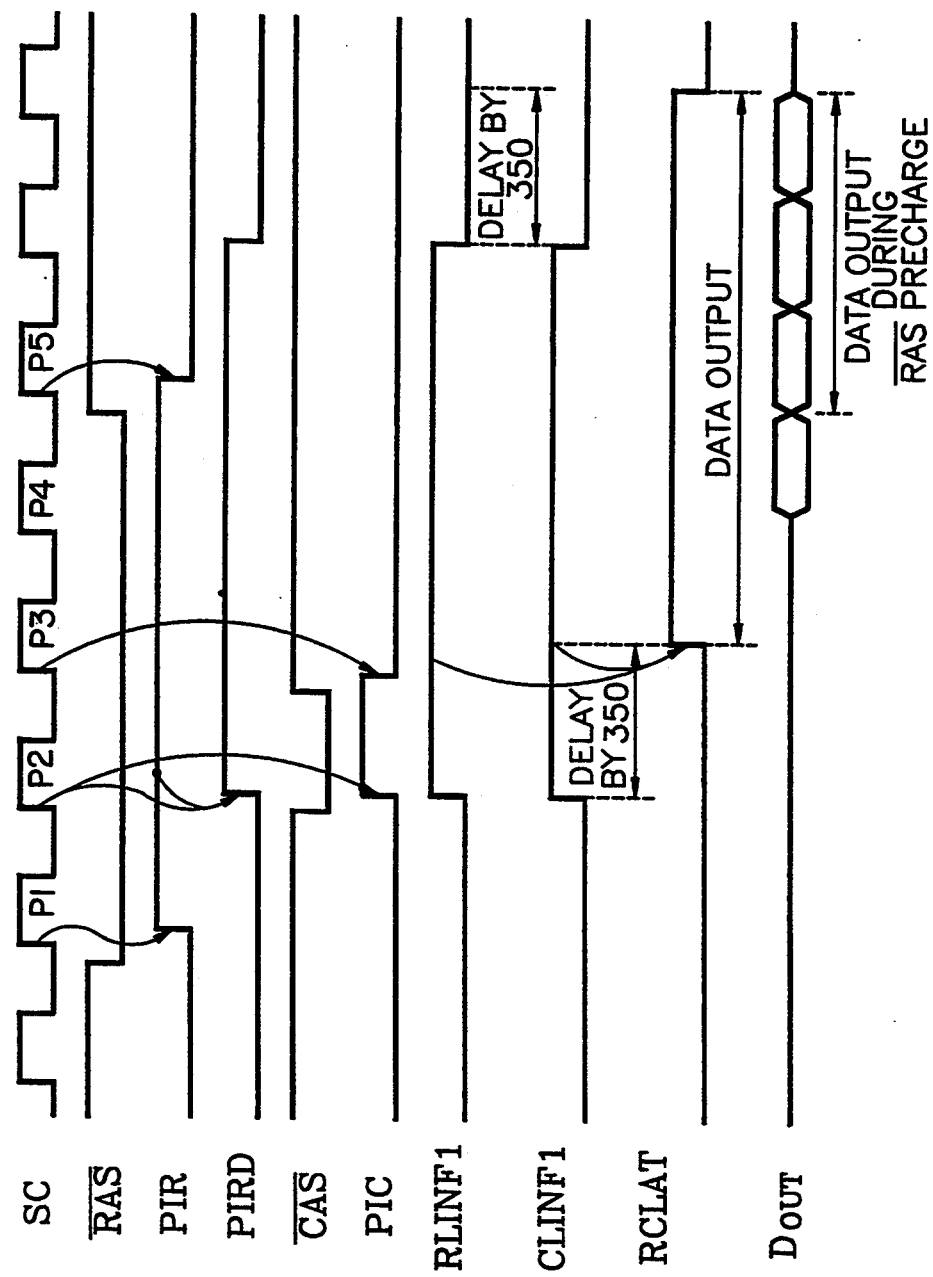
FIG. 6C is a timing diagram of a read operation in the device of FIG. 5.

The timing diagram of FIG. 6C shows a data read operation for the case where data output margin signal PIRD is extracted from node RN2 of second stage RCS2 of a shift register of the $\overline{RAS}$ signal processor 100' shown in FIG. 6A.

Figure 6D:
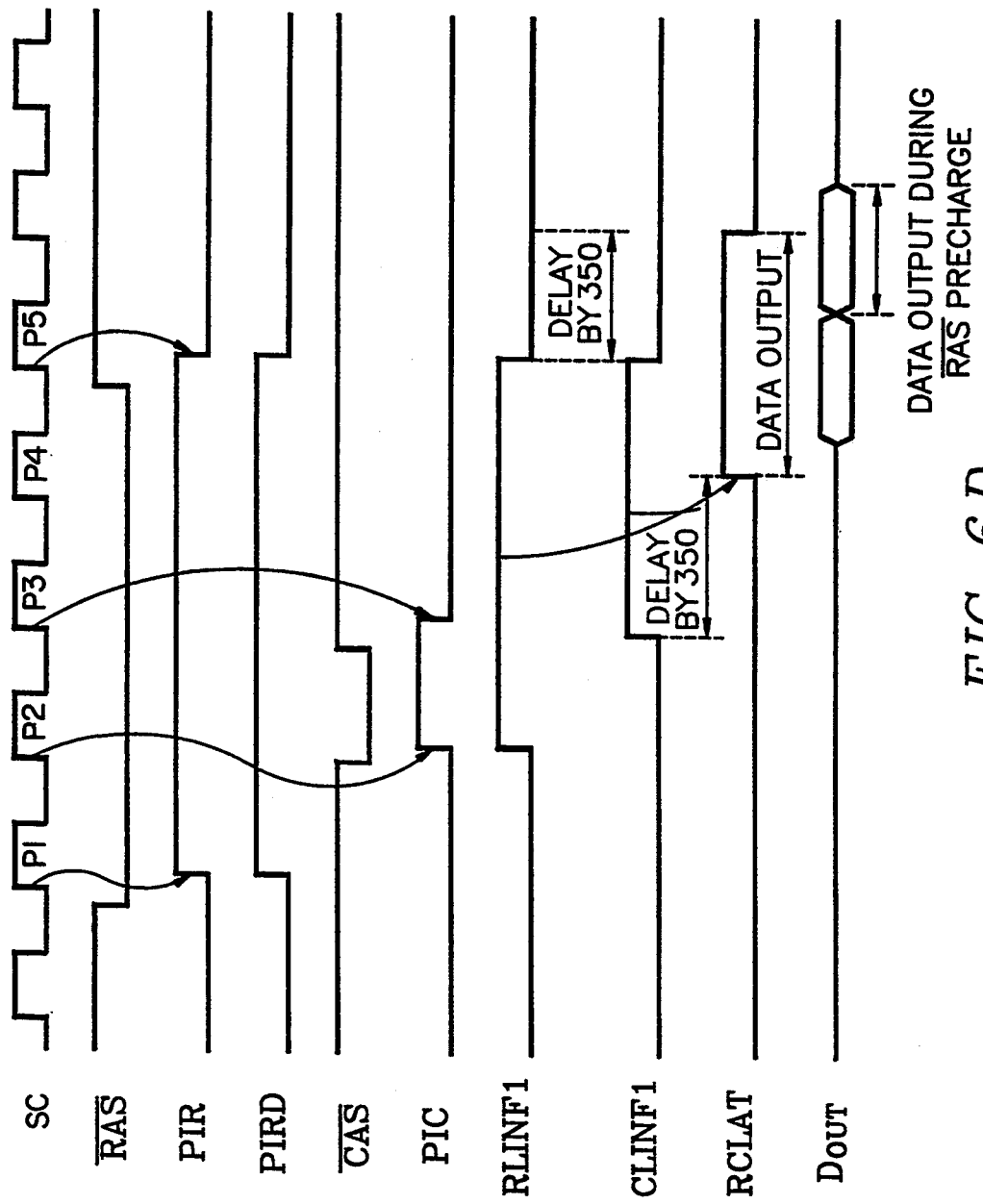
FIG. 6D is a timing diagram of yet another read operation in the device of FIG. 5.

The timing diagram of FIG. 6D shows a data read operation for the case where data output margin signal PIRD is extracted from node RN1 of first stage RCS1. The operation of the embodiments of the present invention shown in FIG. 5 and FIGS. 6A-6D correspond substantially with the operation of the embodiments shown in FIGS. 3-4D and will therefore not be described further.

In the above discussed embodiments of the present invention, latency signal RCLAT was described as a signal providing information on the $\overline{RAS}$ signal and the $\overline{CAS}$ signal. It can be generated using either the $\overline{RAS}$ signal or the $\overline{CAS}$ signal. For example, in case of using the $\overline{RAS}$ signal only in the circuit of FIG. 3, one among the $\overline{RAS}$ latency signals RLINF1-RLINFi is changed to an active state by using the $\overline{RAS}$ signal processor 100 only, and supplied to the latency combination circuit 300, without configuring the $\overline{CAS}$ signal processor 200 for generating the $\overline{CAS}$ latency signal.

As described so far, the memory device of the present invention is capable of controlling output data in synchronism with the system clock SC supplied from an external source by using the information on the $\overline{RAS}$ and/or the $\overline{CAS}$ address strobe signals. Therefore, the present invention allows a memory device that uses a high-frequency clock being supplied from the CPU to effectively control the data output for the faster operation speed. Moreover, the present invention is capable of generating normal output data even after the $\overline{RAS}$ precharge at least until the beginning of the next $\overline{RAS}$ cycle. Therefore, the present invention can generate more output data than the number of output data that can be generated by the conventional memory devices during one $\overline{RAS}$ cycle.

What is claimed is:

1. A synchronous semiconductor memory device comprising:
   memory means for storing data;
   data output buffer means for outputting data stored in the memory means in response to a data output buffer control signal; and
   latent signal processing means responsive to a clock signal, an address strobe signal and a combination signal for generating said data output buffer control signal to control the outputting of data from said data output buffer,
   wherein the data output buffer control signal generated by said latent signal processing means is in sync with said clock signal, and is active for at least a first period when said address strobe signal is active as well as for at least a second period during a memory precharge period when said address strobe signal is inactive, said data output buffer outputting data stored in said memory means during both said first and second periods.

2. A synchronous semiconductor memory device as defined in claim 1, wherein said address strobe signal is a row address strobe signal.

3. A synchronous semiconductor memory device as defined in claim 1, wherein said address strobe signal is a column address strobe signal.

4. A synchronous semiconductor memory device as defined in claim 1, wherein said address strobe signal includes both row and column address strobe signals.

5. A synchronous semiconductor memory device as defined in claim 1, wherein said clock signal is supplied from an external source.

6. A synchronous semiconductor memory device as defined in claim 1, wherein said combination signal is an address combination signal.

7. A synchronous semiconductor memory device including a data output buffer operating under the control of an address strobe signal and a clock signal, comprising:
   shifting means including a plurality of clock stages for shifting said address strobe signal therethrough under the control of said clock signal;
   means for extracting a data output margin signal from a predetermined node of one of said clock stages; and
   means, responsive to said data output margin signal, input address signals, and outputs from said clock stages, for generating a data output buffer control signal to control the output of data from said data output buffer.

8. A synchronous semiconductor memory device as defined in claim 7, wherein said data output buffer control signal is active for at least a first period when said address strobe signal is active as well as for at least a second period during a memory precharge period when said address strobe signal is inactive, said data output buffer outputting data stored in said memory means during both said first and second periods.

9. A synchronous semiconductor memory device as defined in claim 7, wherein said clock signal is supplied from an external source.

10. A synchronous semiconductor memory device including a data output buffer operating under the control of a row address strobe signal and a column address strobe signal, comprising:
    first shifting means having a plurality of clock stages for shifting said row address strobe signal therethrough in response to a clock signal;
    means for extracting a data output margin signal from a predetermined stage among the clock stages of said first shifting means;
    first combining means for generating a plurality of first latency signals in response to row address signals, signals output from said clock stages of said first shifting means, as well as on the basis of said data output margin signal;
    second shifting means having a plurality of clock stages for shifting said column address strobe signal therethrough in response to said clock signal;
    second combining means for generating a plurality of second latency signals in response to column address signals, signals output from said clock stages of said second shifting means, as well as on the basis of said data output margin signal; and
    third combining means responsive to said first and second latency signals for generating a data output buffer control signal to said data output buffer to control the output of data from said data output buffer.

11. A synchronous semiconductor memory device as defined in claim 10, wherein said data output buffer control signal is active for at least a first period when said address strobe signal is active as well as for at least a second period during a memory precharge period when said address strobe signal is inactive, said data output buffer outputting data stored in said memory means during both said first and second periods.

12. A semiconductor memory device as defined in claim 11, wherein said clock signal is supplied from an external source of the semiconductor memory device.

* * * * *